United States Patent [19]
Bass

[11] Patent Number: 5,892,656
[45] Date of Patent: Apr. 6, 1999

[54] THERMOELECTRIC GENERATOR

[76] Inventor: John C. Bass, 6121 La Pintura Dr., La Jolla, Calif. 92037

[21] Appl. No.: 650,299

[22] Filed: May 20, 1996

Related U.S. Application Data

[63] Continuation-in-part of Ser. No. 139,311, Oct. 19, 1993, Pat. No. 5,625,245, and Ser. No. 417,676, Apr. 6, 1995, abandoned.

[51] Int. Cl.⁶ ..................................................... H05K 7/20
[52] U.S. Cl. ..................... 361/699; 29/890.031; 62/3.7; 62/259.2; 136/203; 257/930; 361/712
[58] Field of Search ........................... 310/301, 306; 437/2–4, 51, 209; 29/727, 890.03, 890.031; 257/64, 930, 712–724; 62/3.2, 3.3, 3.6, 3.7, 259.2; 165/80.3, 80.4, 104.33, 133, 185; 136/203–205, 211, 224; 361/699, 702, 704, 712, 705–708, 776, 789

[56] References Cited

U.S. PATENT DOCUMENTS

| | | | |
|---|---|---|---|
| 3,830,664 | 8/1974 | Winkler | 136/202 |
| 4,497,973 | 2/1985 | Heath | 136/212 |
| 4,611,089 | 9/1986 | Elsner | 136/230 |
| 4,734,139 | 3/1988 | Shakun | 136/210 |
| 4,859,250 | 8/1989 | Buist | 136/225 |
| 5,367,890 | 11/1994 | Doke | 62/3.7 |
| 5,436,467 | 7/1995 | Elsner | 257/15 |
| 5,448,109 | 9/1995 | Cauchy | 257/719 |
| 5,625,245 | 4/1997 | Bass | 310/306 |

*Primary Examiner*—Gerald P. Tolin
*Attorney, Agent, or Firm*—John R. Ross

[57] ABSTRACT

A thermoelectric generator system. The thermoelectric generator has at least one hot side heat exchanger and at least one cold side heat exchanger and at least one thermoelectric module with thermoelectric elements installed in an injection molded eggcrate. The thermoelectric modules are held in close contact with the hot side heat exchanger and the cold side heat sink with a spring force. A preferred embodiment contains eight modules held in compression between the hot and cold heat exchangers with Belville springs. The eggcrate is molded from a high temperature plastic with ridges provided for extra strength and tapered walls to permit ease of installation of the thermoelectric elements and stop tabs assure correct positioning of the elements. Electrical connections at hot and cold surfaces are preferably made by thermal spraying metallize coatings on the surfaces and then surface finishing the module to expose the walls of the eggcrate.

20 Claims, 12 Drawing Sheets

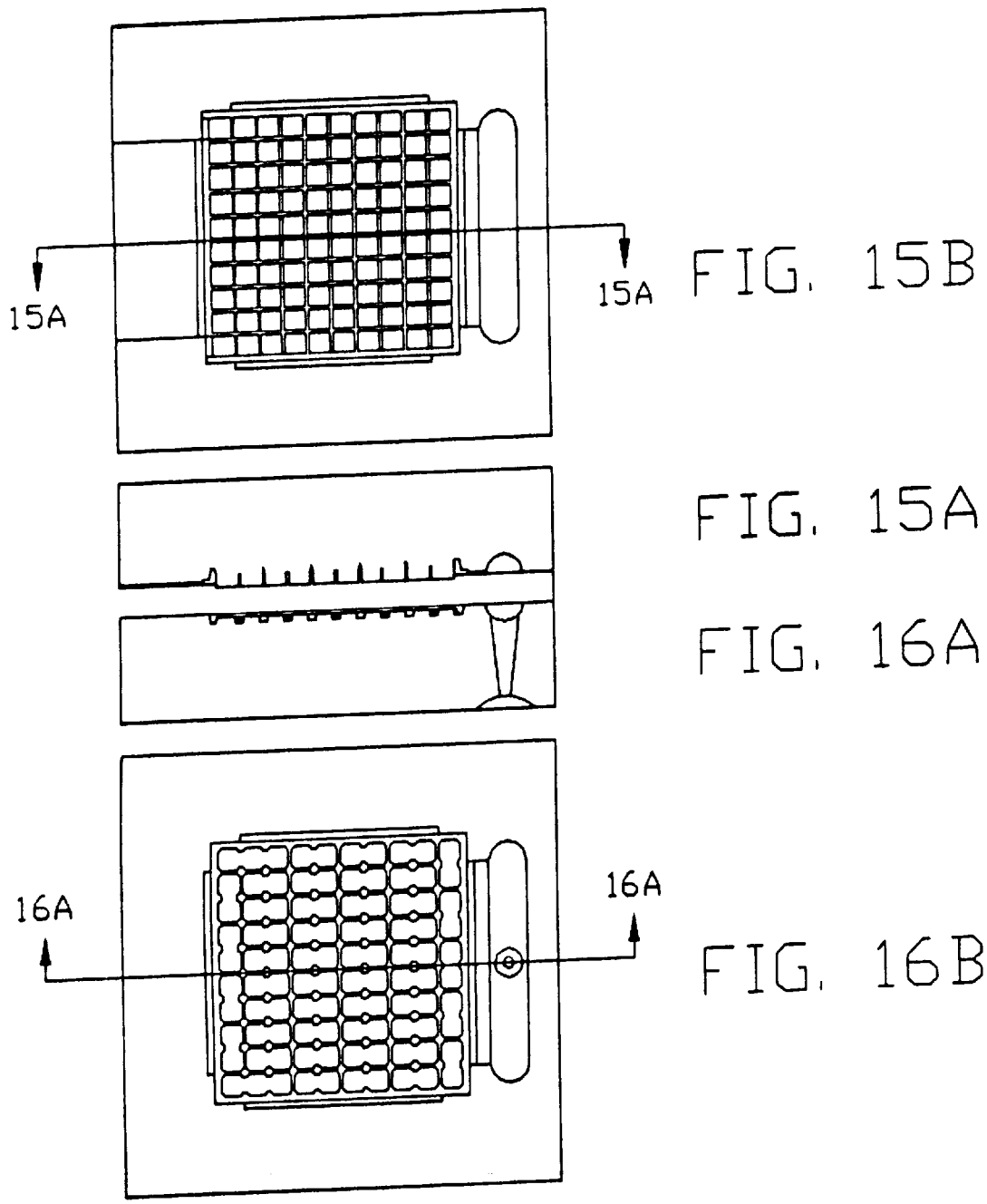

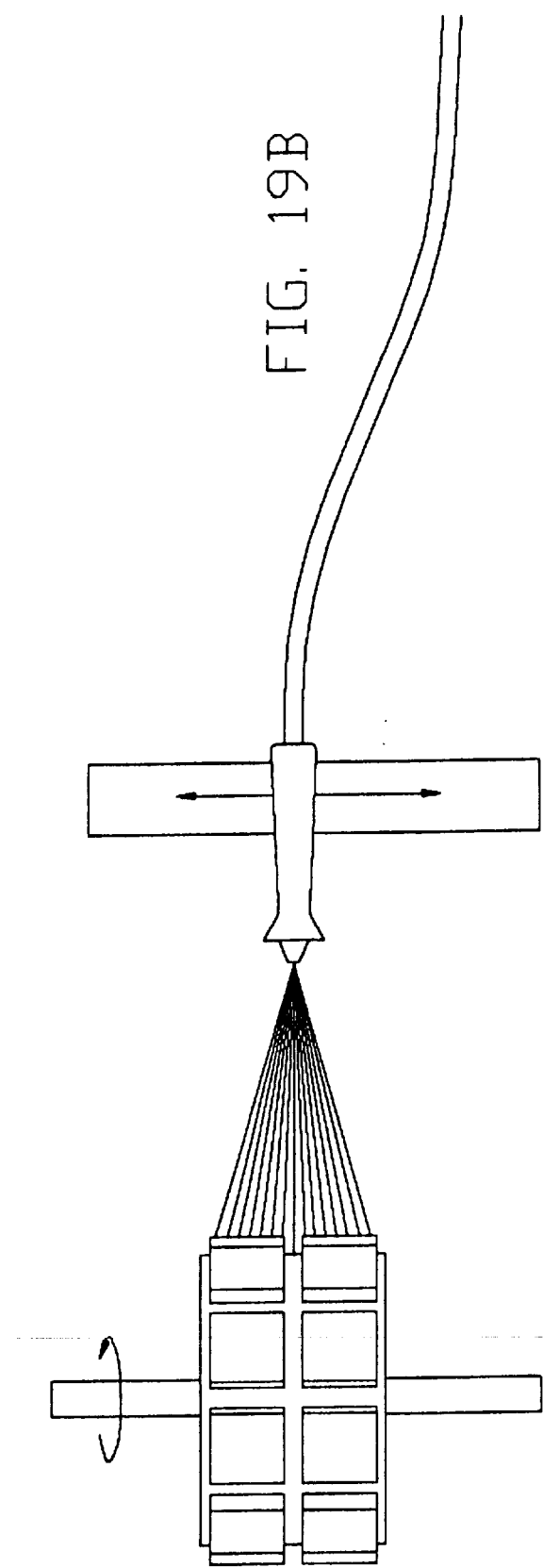
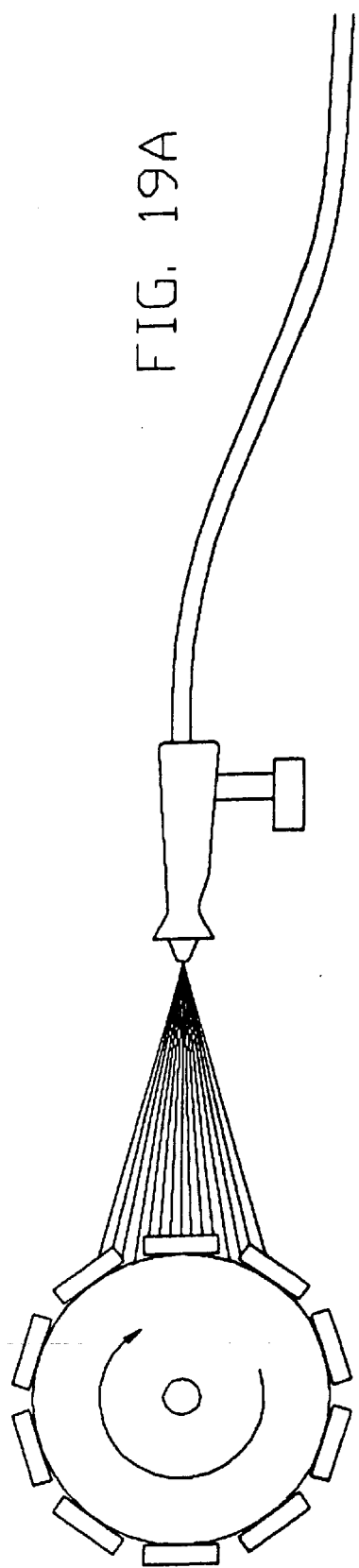
FIG. 19B
FIG. 19A

THERMOELECTRIC GENERATOR

This invention is a continuation-in-part application of Ser. No. 08/139,311 filed Oct. 19, 1993 now U.S. Pat. No. 5,625,245 and Ser. No. 08/417,676 filed Apr. 6, 1995, now abandoned.

This invention relates to thermoelectric generators.

BACKGROUND OF THE INVENTION

Thermoelectric devices are well known. These devices utilize physics principals known as the Seebeck effect discovered in 1821 and the Peltier effect discovered in 1834. The Seebeck principle tells us that if two wires of different materials (such as copper and iron) are joined at their ends, forming two junctions, and one junction is held at a higher temperature than the other junction, a voltage difference will arise between the two junctions. The Peltier effect describes an inverse effect. If current is sent through a circuit made of dissimilar materials, heat will be absorbed at one junction and given up or evolved at the other junction.

Most thermoelectric devices currently in use today to generate electricity or for cooling utilize semiconductor materials (such as bismuth telluride) which are good conductors of electricity but poor conductors of heat. These semiconductors are typically heavily doped to create an excess of electrons (n-type) or a deficiency of electrons (p-type). An n-type semiconductor will develop a negative charge on the cold side and a p-type semiconductor will develop a positive charge on the cold side.

Since each element of a semiconductor thermoelectric device will produce only a few millivolts it is generally useful to arrange the elements in series so as to produce higher voltages for the generation of electricity or to permit use of higher voltages for cooling. Several techniques have been developed for arranging the semiconductor elements in series in thermoelectric devices. In one such prior art method p and n type semiconductors are arranged in a checkerboard pattern and electrical jumpers are soldered, each to two different semiconductors, at the cold side and at the hot side so as to place all of the semiconductor elements in series with each other. This method is a low cost method and well established but has some limitations. Above 100° C. the solders can defuse into the thermoelectric elements destroying them. In a high humidity atmosphere moisture may condense in the spaces between the elements and thermally short the module. The structure is not mechanically strong and easily fractures.

Another currently used method is the so-called eggcrate design. Here an "eggcrate" made of insulator material separates the thermoelectric elements and permits electrical jumpers to be pressed against the elements to provide a good electrical connection without solder. In prior art designs, the eggcrates are fabricated from individual walls which have been cut to shape using a precision laser cutter. All of the elements can be connected in series by proper construction of the eggcrate. Obviously it is possible in both devices to arrange for any desired number of elements to be in series. Thus, several elements in series may form a series set and this set could be arranged in parallel with other similar sets.

Prior art thermoelectric generators are expensive due primarily to labor costs to assemble the eggcrates to install the elements in the crates and to form the modules into a generator unit. What is needed is a lower cost thermoelectric generator.

SUMMARY OF THE INVENTION

The present invention provides a thermoelectric generator. The thermoelectric generator has at least one hot side heat exchanger and at least one cold side heat exchanger and at least one thermoelectric module with thermoelectric elements installed in an injection molded eggcrate. The thermoelectric modules are held in close contact with the hot side heat exchanger and the cold side heat sink with a spring force. A preferred embodiment contains eight modules held in compression between the hot and cold heat exchangers with Belville springs. The eggcrate is molded from a high temperature plastic with ridges provided for extra strength and tapered walls to permit ease of installation of the thermoelectric elements and stop tabs assure correct positioning of the elements. Electrical connections at hot and cold surfaces are preferably made by thermal spraying metallized coatings on the surfaces and then surface finishing the module to expose the walls of the eggcrate.

BRIEF DESCRIPTION OF THE DRAWINGS

FIG. 11 shows a section of an eggcrate.

FIGS. 15A and B and 16A and B show a mold for making the eggcrate.

FIG. 19 shows our metallizing process.

DETAILED DESCRIPTION OF PREFERRED EMBODIMENTS

Preferred embodiments of the present invention may be described by reference to the figures.

Thermoelectric Generator Unit

Figure 20:
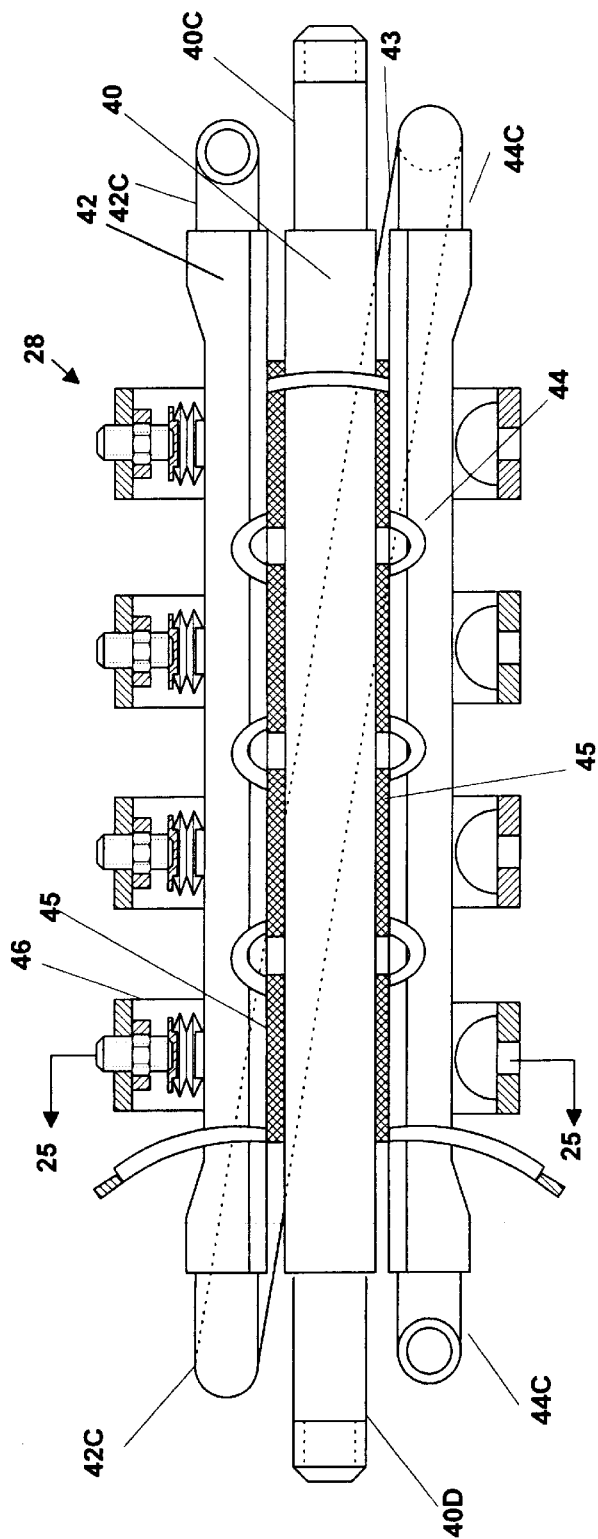
FIG. 20 is a detailed drawing of the thermoelectric generator shown in FIG. 22.
Figure 21:
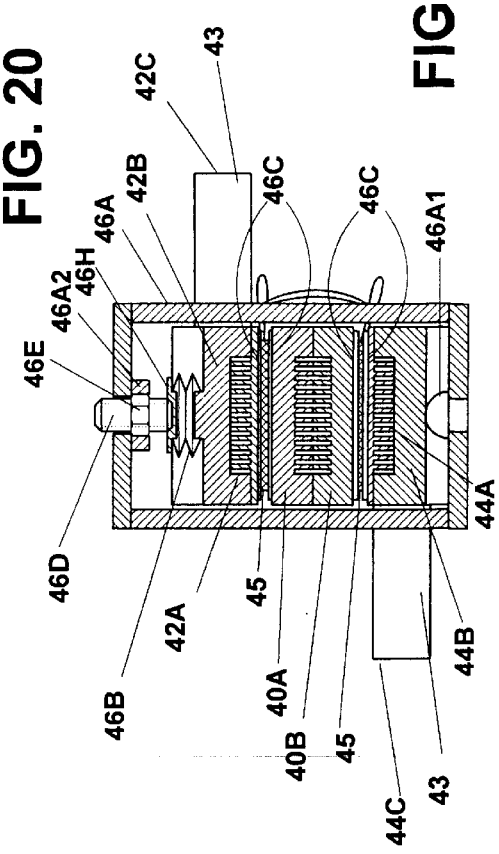
FIG. 21 is a section of FIG. 20.
Figure 22:
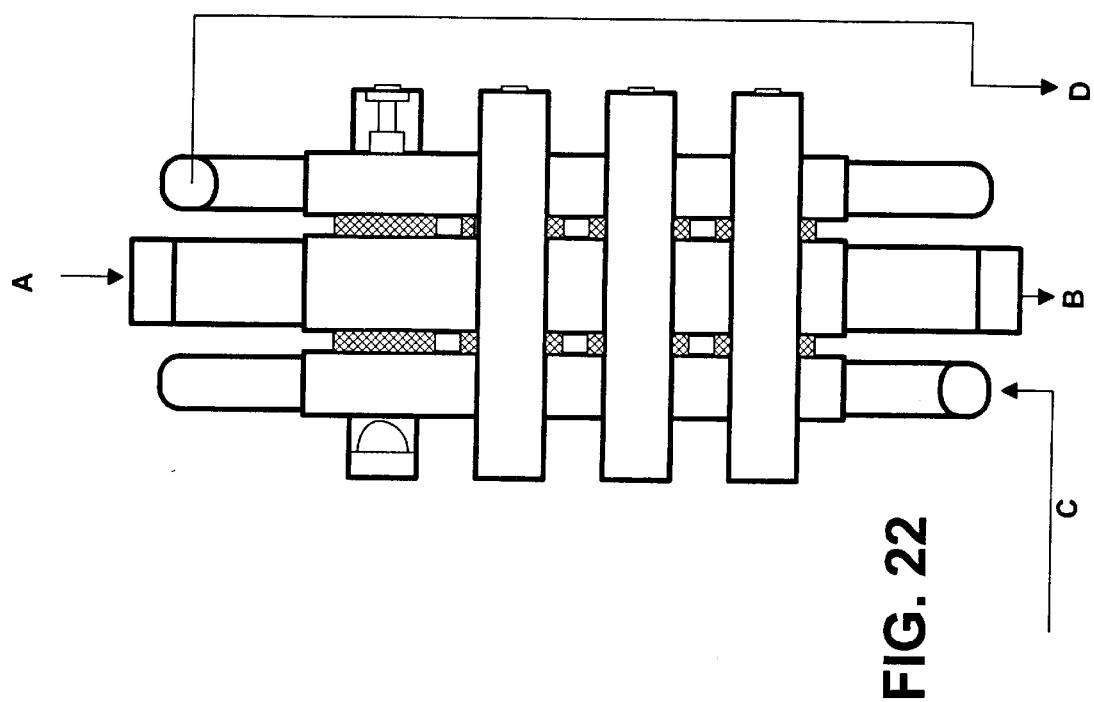
FIG. 22 is an outline drawing of a preferred embodiment thermoelectric generator.

A schematic drawing of a thermoelectric generator 28 is shown in FIG. 22 and a detailed version of generator is shown in FIGS. 20 and 21. The unit comprises of one hot side heat exchanger 40, a first cold side heat exchanger 42, connecting hose 43 and a second cold side heat exchanger 44, eight thermoelectric modules 45 electrically connected in series and four spring loaded compression elements 46. The hot glycol enters hot side heat exchanger 40 at A and exits at B as shown in FIG. 22. The cool glycol enters one of the cold side heat exchangers 42 at C, passes through it and connecting hose 43 (shown in FIG. 20) and then passes through the other cold side heat exchanger 44 and exits at D, as shown in FIG. 22.

Heat Exchangers

The hot side heat exchanger 40 is in this embodiment a welded steel structure. The body of the heat exchanger is 14½ inches long and 3 inches wide. It is basically constructed of two identical machined finned sections 40 A and 40 B. These two sections are welded together and nipples 40 C and 40 D are welded at opposite ends of the heat exchanger as shown in FIG. 20 to form a finned passage for the hot glycol. Each of the cold side heat exchangers is also a welded steel structure. They each comprise a finned section 42 A and 44 A and a cover plate 42 B and 44 B which are welded together and to nipples 42 C and 44 C to form a finned passage for the cool glycol.

Compression Elements

Compression elements 46 comprise a steel frame 46 A which is basically a four sided rectangular frame with outside dimensions of 5.64 inches high, 3¾ inches wide and 1¾ inches thick. The frame provides a rectangular space 3.12 inches wide and 5.02 inches high for the heat exchangers and the thermoelectric modules 45 to fit into. Each frame also comprises a thrust button 46 A 1 and a nut plate 46 A 2 containing a hexagonal nut matching space. Compression elements 46 each provide about 1000 pound compression on the heat exchangers and the thermoelectric modules. This is accomplished with a Belville spring stack 46 B. each of which are centered over two thermoelectric modules 45 each of which in turn are sandwiched between two thin (0.01 inch thick) alumina ($Al_2O_3$) wafers 46 C as shown in FIG. 21. The load is provided by tightening adjustment screw 46 D through nut 46 E to compress spring stack 46 B. Torque produced by screw 46 D on nut 46 E is resisted by nut plate 46 A 2. Upward thrust produced by screw 46 D is absorbed on the top side by adjusting nut 46 E and then steel frame 46 A to thrust button 46 A 1 located on the opposite side of compression element 46. Downward thrust from screw 46 D is absorbed on the bottom side by by load washer 46 H and the spring stack 46 B. Thus, the two thermoelectric modules 45 are held in tight compression between the heat exchangers by opposite forces of about 1000 pounds provided by thrust button 46 A 1 and spring stack 46 B.

Well Head Dehydration Installation

Figure 23:
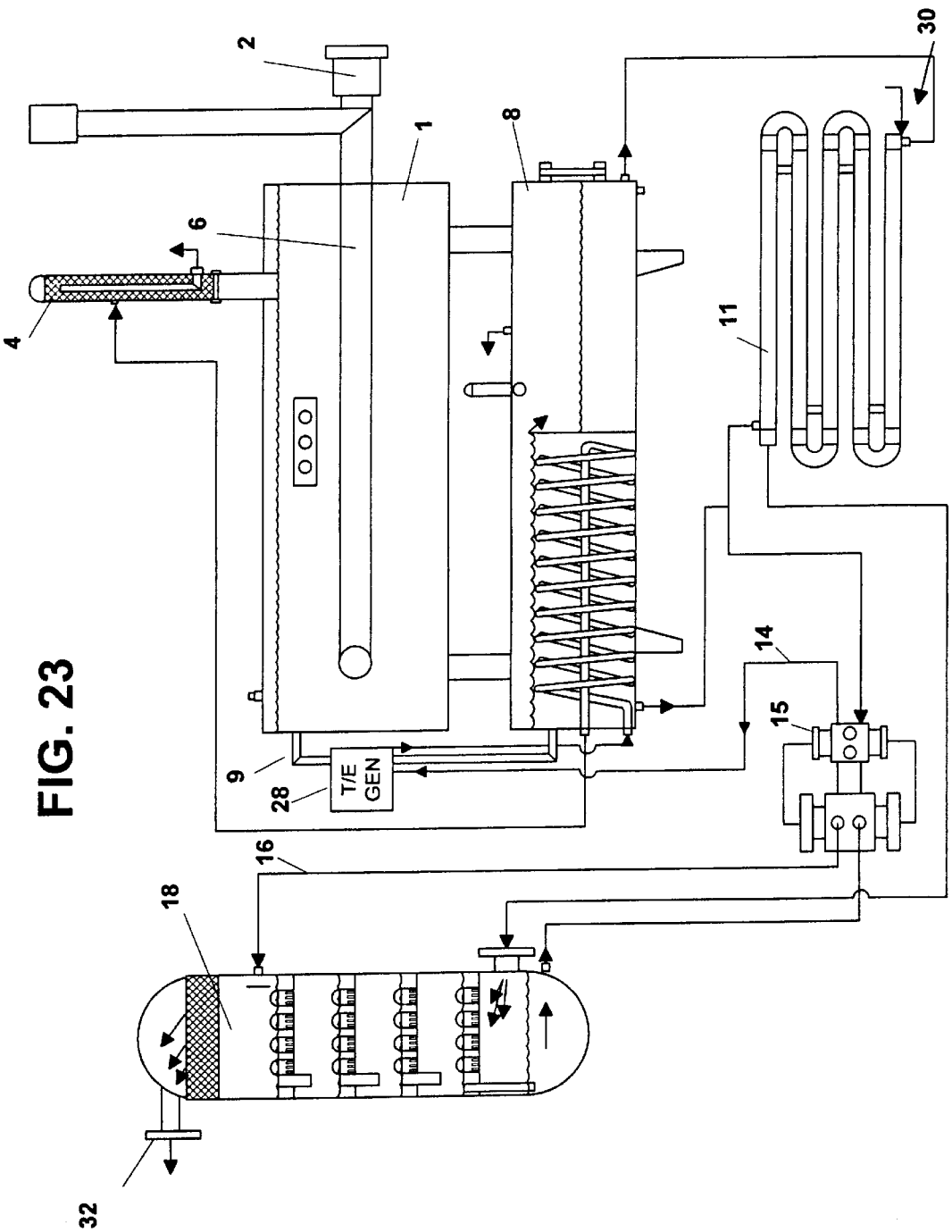
FIG. 23 shows where the thermoelectric generator shown in FIG. 22 fits in a well head dehydration plant.

In one preferred embodiment of the present invention thermoelectric generating unit 28 is inserted as shown in FIG. 23 in a well head dehydration plant. This thermoelectric generator utilizes as its heat source the hot (375 degrees F.) dry glycol exiting reboiler 1 through pipe 9 and utilizes as its cold sink the cool (60 degrees F.) wet glycol entering preheat heat exchanger 8 through pipe 14.

Thermoelectric Modules

Figure 17:
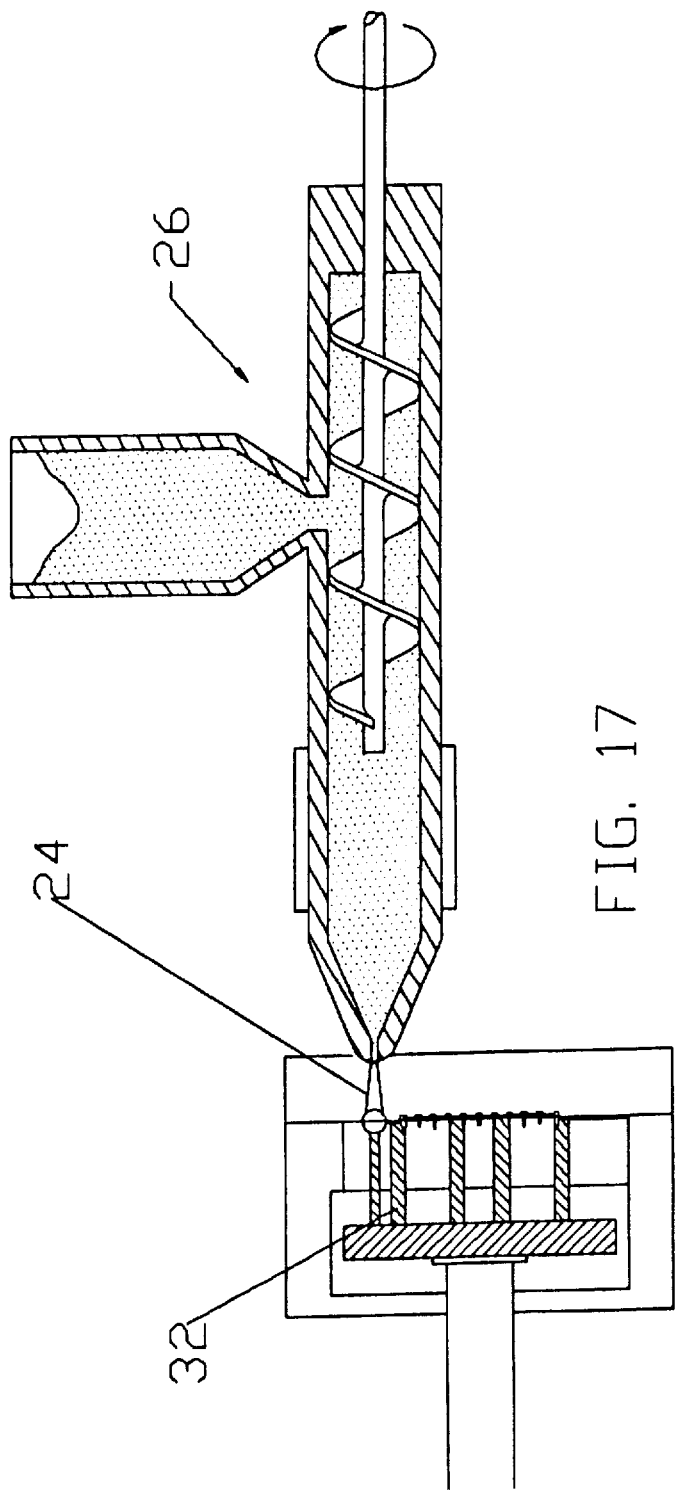
FIG. 17 shows our injection molding process.
Figure 18:
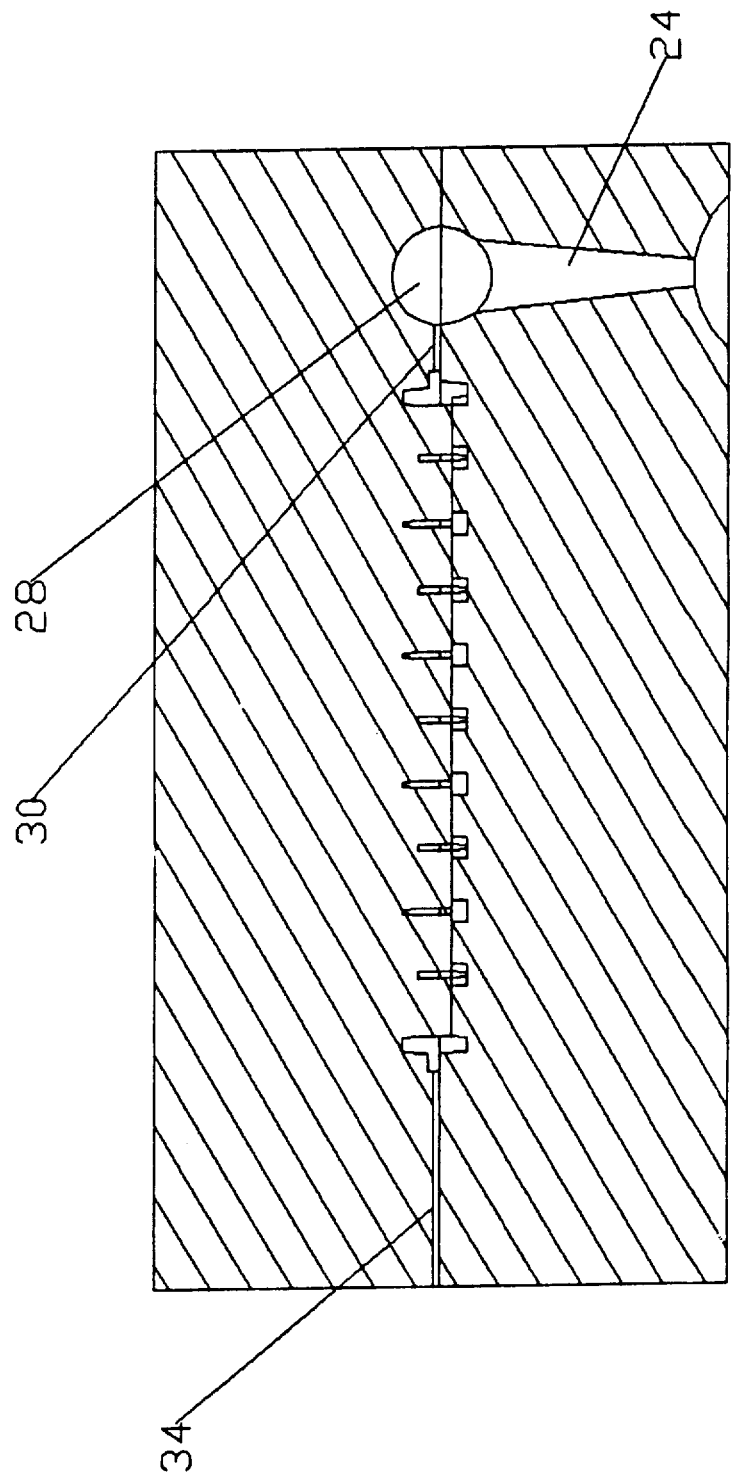
FIG. 18 shows the mold fitted together.

Following is a description to a preferred process for fabricating an eggcrate type thermoelectric modules 45 for use in the thermoelectric generator discussed above.
Injection Molded Eggcrate The eggcrate for this preferred embodiment is injection molded using the mold pattern shown in FIGS. 15A and B and 16A and B. FIGS. 15A and B show the bottom of the mold pattern and FIGS. 16A and B show the top of the pattern. The top and bottom are shown in their molding position in FIG. 18. A high temperature thermo plastic, such as the liquid crystal polymer resin, Dupont Zenite, is injected through sprue 24 using well known plastic molding techniques in an injection molding machine 26 as depicted in FIG. 17. The Dupont Zenite plastic is dried at 275 F. and the barrel temperatures of the molding machine range from 625 F. at the rear to 640 F. near the nozzle. Both the bottom mold and the top mold are maintained at a temperature of about 200 F. Zenite melts at about 550° F. In the usual manner the fluid plastic passes through sprue 24, runner 28, and gate 30 into the mold cavity. The vent is shown at 34 in FIG. 18. The finished part is ejected by injection pins 32 as shown in FIG. 17. Initial production runs made by applicants supplier have produced excellent eggcrates at a rate of about 50 eggcrates per hour. This rate can easily be increased to 200 eggcrates per hour for one worker and ultimately the process can be completely automated. This compares to a one worker production rate of about 3 eggcrates per hour with the prior art method of assembling thermoelectric module eggcrates from appropriately slotted layers of insulating materials.

Figure 1A:
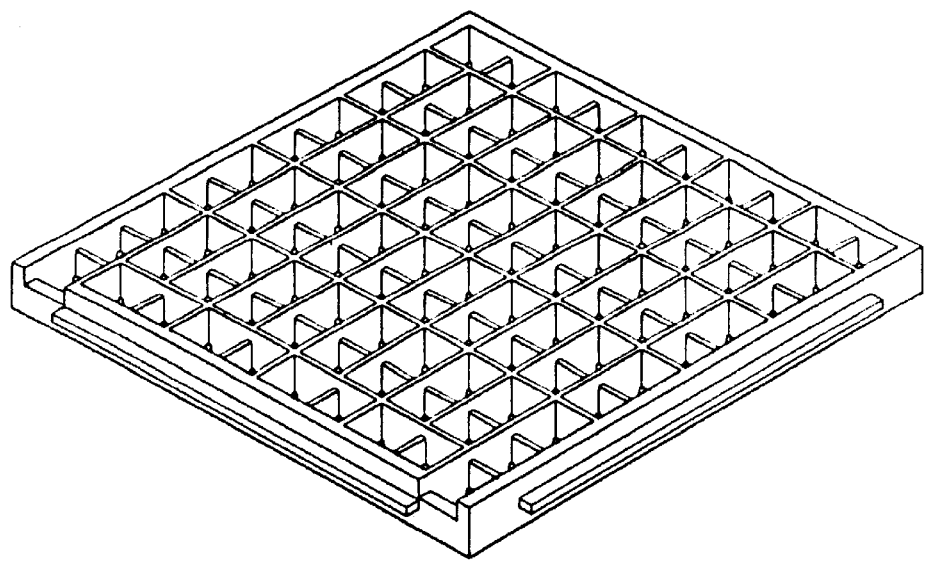
FIGS. 1A and B are two views of an eggcrate according to the present invention.
Figure 10:
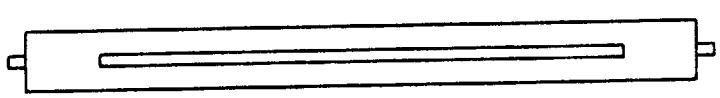
FIG. 10 show an end view.
Figure 11:
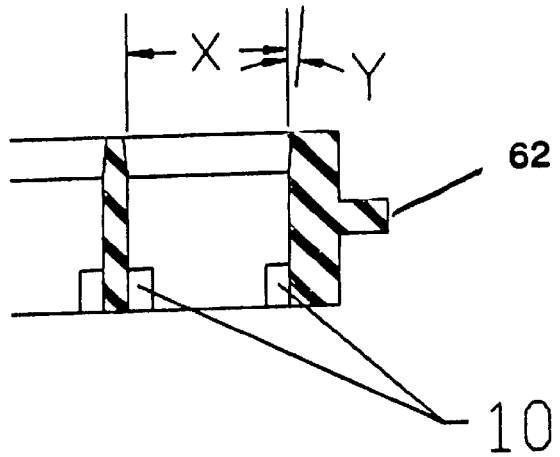
Figure 12:
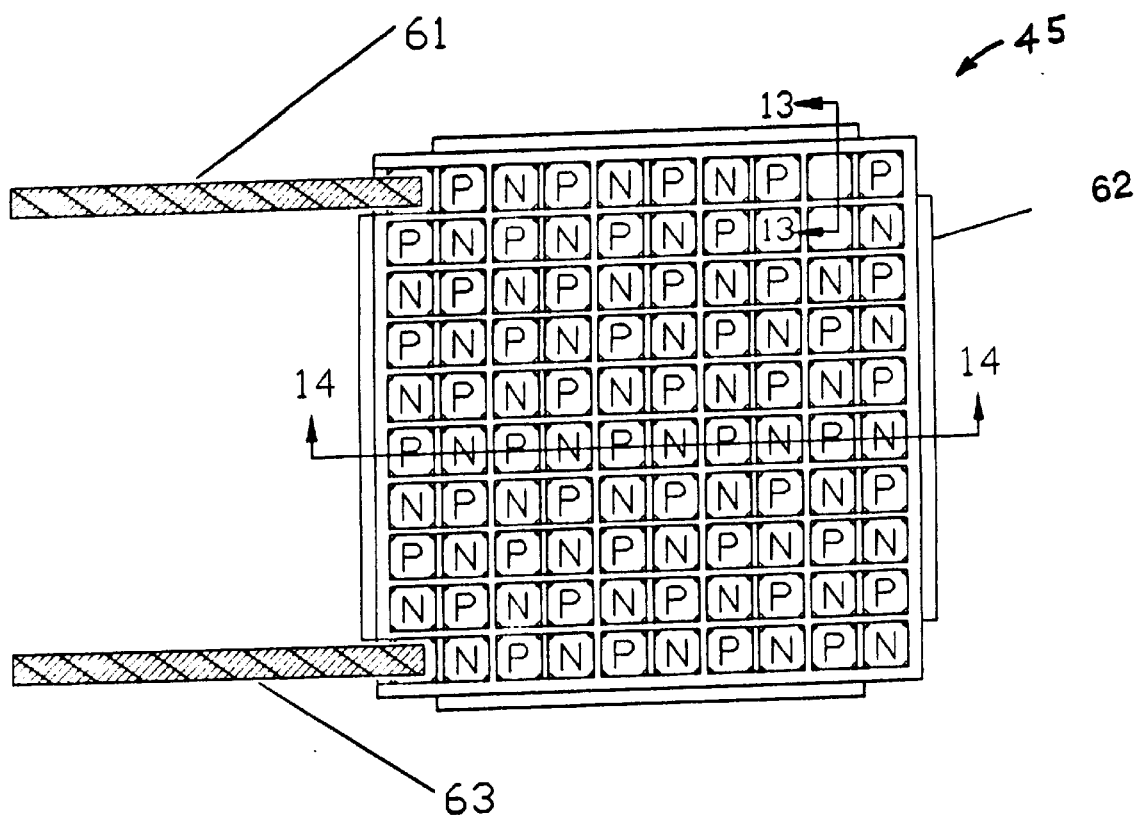
FIGS. 12 and 14 show a preferred element arrangement.

The completed injection molded eggcrate is shown in FIG. 1A. This embodiment contains boxes (spaces) for 100 thermoelectric elements. The dimension of the elements are 5.1 mm×5.1 mm×3.0 mm. The dimension of the spaces at the bottom of the eggcrate are 5.1 mm×5.1 mm. A top view of the eggcrate is shown in FIG. 1. FIGS. 2 through 9 show various sections through the eggcrate. FIG. 10 is a side view and FIG. 11 is a sectional view which shows an expanded view of one of the boxes created by the eggcrate. Note that the upper part of the walls of the box is tapered 5 degrees as shown at Y in FIG. 11. In this embodiment the straight part of the walls of the box forms a 0.2 inch square as shown at X in FIG. 11. This dimension is held to a tolerance of plus 0.001 inch to provide a tight fit for thermoelectric elements which are 0.200 inch square with a tolerance of minus 0.001. Note that a support ridge 62 as shown in FIGS. 11 and 12 is provided around the boundary of the eggcrate at the midplane between the two surface planes of the eggcrate. This support ridge provides extra strength for the eggcrate and is utilized during subsequent stages of module fabrication and can be useful in mounting the completed module for use.

Figure 1B:
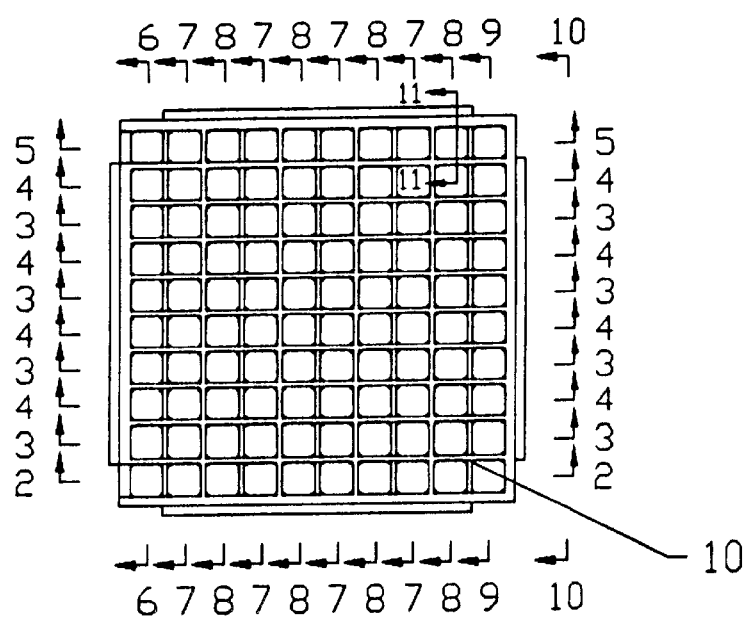
Figure 5:
FIGS. 2 through 9 and 11 are section views of the above eggcrate.
Figure 4:
Figure 3:
Figure 2:
Figure 6:
Figure 7:
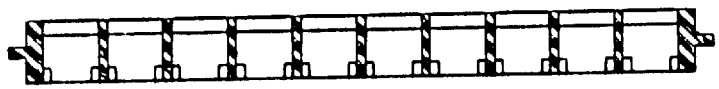
Figure 8:
Figure 9:
Figure 13:
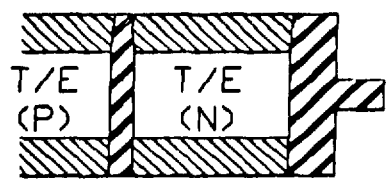
FIG. 13 shows an enlarged view of a portion of a cross section of a module showing parts of the eggcrate, the elements and metal coatings.
Figure 14:

FIG. 12 shows a top view of the eggcrate with the locations indicated for the P and N elements. The elements are placed in these locations with the installer assuring that each element rest firmly against stops 10 as shown in FIGS. 1B and 11. Conductor material is then sprayed on the top and bottom of the eggcrate as shown in FIGS. 19A and 19B, and then the conductor material at the tops and bottoms are ground down until the tops of all insulator surfaces are cleared of conductor material. A preferred procedure for loading the eggcrate is discussed in detail below. FIGS. 13 and 14 show examples of sections of the finished product at location 13—13 and 14—14 as shown in FIG. 12. Note in FIG. 14 how the effect is to connect all the thermoelectric elements in series electrically. In this particular section the hot surface is on the top and the electron flow is from left to right.

Thermoelectric Elements

Thermoelectric elements with dimensions of 5.1 mm×5.1 mm×3.0 mm are prepared using any of several well known techniques such as those described in Thermoelectric Materials edited by Sittig, published in 1970 by Noyes Data Corporation, Park Ridge, N.J. Preferred materials are Lead Telluride for high temperature applications and Bismuth Telluride for low temperature applications. These elements may also be purchased commercially from suppliers such as Melcor Corporation with offices in Treton, N.J. One half of the elements should be "n" elements and one half "p" elements. Alternatively, ingots of "p" and "n" type thermoelectric material may be extruded and then sliced into "p" and "n" type thermoelectric elements in accordance with well known techniques.

Loading the Eggcrates

The "p" elements are positioned in the appropriate boxes of the egg create as shown in FIG. 12. The element should be snug against the stop. The "n" elements are also positioned in the appropriate boxes of the egg crate as shown in FIG. 12. Each element should be snug against the stop. A 2 inch long 1/8 inch wide copper mesh wire lead is inserted at positions 61 and 63 as shown in FIG. 12. At the location of the junction of the leads to the module we provide two "p" elements and two "n" elements side by side and electrically in parallel for extra support for the leads to reduce the likelihood that the leads would break loose.

Metallizing the Hot and Cold Surfaces

Using spring loaded clamps, we clamp a number of modules to a rotatable mandrel. In FIGS. 19A and B we show 20 modules clamped to such a mandrel. We then grit blast the module/element surface with 180–240 grit Al2O3 to a uniform matte finish with the mandrel rotating at 55 rpm. Then we use compressed air to blow the module/element surface clean. Next we apply a metal thermal spray coating to the exposed surface using a thermal spray coating system as shown in FIGS. 19A and B. These spray techniques are well known. Further specific details are provided in Metals Handbook, Ninth Edition, published by the American Society for Metals. A variety of metals can be used to coat the surface. Our preferred coating is a two-layer coating comprising a first approximately 0.006 inch thick coating of molybdenum and a second approximately 0.06 inch thick coating of aluminum. Both coatings are applied using the system shown in FIGS. 19A and B with the mandrel rotating at 55 rpm and the spray gun running back and forth at speeds of about 0.2 inch per second. After the first surface is coated we remount the modules to expose the unsprayed surface and repeat the above described process with the second coating.

Grind the Module Surfaces

The surfaces must be ground down to expose the eggcrate walls. To do this we position a sprayed module in the mounting chuck of a surface finishing machine. We reduce the surface of the module to the appropriate height as measured from eggcrate tab 62 shown in FIGS. 11 and 12. We then remove the module from the chuck, reverse the module and reduce the opposite face of the module until the module surface is the appropriate height from the egg crate tab.

Inspection

We heat the hot surface of the module to 250 C. and cool the cold side of the module to 50 C. We then measure the open circuit voltage of the module. It should be about 3.2 volts with bismuth telluride elements. We then apply an electrical load to the module until the voltage drops to 1.6 volts and measure the current. We calculate the power produced by the module as $P=I \times V$. The power level should be at least 13 watts for the bismuth telluride elements.

Performance of the Unit

The total output of the eight thermoelectric modules connected in series, with a hot side temperature of 375 degrees F. and a cold side temperature of about 65 degrees F., will be about 62 watts at about 12 volts. Additional power and higher voltages can be obtained by adding additional thermoelectric generator units. As indicated only a very small percentage of available waste energy of the dehydration plant was utilized in the above described arrangement.

It is known that power output as a function of glycol flow rate for several hot glycol temperatures. For flow rates greater than 10 gpm, it is feasible to connect more than one unit in series to provide increased power. For flow rates above 30 gpm generators should preferably be connected in parallel. For flow rates outside these ranges a redesign of the unit may be preferably making it longer or wider.

Engineers installing the generator in the field may elect to incorporate bypass lines and valves to allow them to bypass the generator. This would allow the generator to be removed from service if not needed or for repair. A flow control valve could be provided if desired although in most cases it would not be needed. If the generator is to be used to provide cathodic protection, the generator would normally be connected to a constant current regulator which will automatically vary the system impedance to match system requirements. If the generator is to be used to provide power for lighting, instruments or communication, the generator would normally be connected to a constant voltage shunt regulator. A battery is not required to make the system operate. However, if the generator is to be used to provide power for a system, such as communication, where the short term peak power requirements is higher than the normal power output from the generator, then a battery and battery and a battery regulator would be included to carry the short term high peak loads. All of this extra equipment can be obtained "off the shelf".

The foregoing description of the present invention has been presented for the purpose of illustration and is not intended to limit the invention to the precise form disclosed. It is understood that many modifications and changes may be effected by those skilled in the art. For example, thermoelectric modules other than the one described could be utilized in which case details of the heat exchanger and compression elements would probably need to be modified appropriately. It is feasible to make modules with many more thermoelectric elements in which case a single thermoelectric module may be sufficient to provide the required voltage. Other well known methods of holding the thermoelectric elements in good thermal contact with the heat exchangers could be used. There maybe advantages of tapping into hot and cold glycol lines at locations other than those described. The heat exchangers were described as welded carbon steel units. These heat exchangers could be made with other well known techniques utilizing teachings of this specification. When sales are high enough to justify it, Applicants plan to manufacture the heat exchangers using aluminum castings. This should greatly reduce the cost. As to the thermoelectric modules, many other materials besides Zenite can be used for injection molded eggcrates. These include Xydar (manufactured by Amaco which is substantially equivalent to Zenite), Rytron produced by Philips, polyethylene, silicones, teflons, and many others. Zenite was primarily selected because of its superior properties (i.e., melting point, thermal stability, etc.) at higher temperatures. Also it should be possible to use a ceramic material in the form of a "slip". (This is the term used for describing a fine ceramic material suspended in a liquid.) After molding, the liquid is removed by drying and /or the mold (typically plaster of paris) absorbing the liquid. The components are then sintered to give them strength. Zenite, in fact, contains a fine glass powder filler to reduce material costs and control other material properties. This filler could be some other material such as carbon or come chopped fibers made from fiber glass, graphite fibers, etc. Other moldable materials which could be used are organic precursors that transform from the organic to the inorganic state when heated. Materials of this nature would be very desirable for higher temperature eggcrates that would be used with high temperature thermoelectric materials such as PbTe and SiGe which operate at temperatures greater than 350° C. which is typically an upper limit on most organic materials. These materials would allow the eggcrate to be loaded to higher values at temperatures where organic materials typically lose their strength. Phosphate and silicate pastes and cements might also be used for the eggcrate material for high temperature applications. These materials could be formed into eggcrates using silk-screening techniques used in the electronics industry. Accordingly it is intended by the appended claims to cover all modifications and changes as fall within the true spirit and scope of the invention.

I claim:

1. A thermoelectric generator comprising:
    1) at least one hot side heat exchanger,
    2) at least one cold side heat exchanger,
    3) at least one thermoelectric module positioned between said at least one hot side heat exchanger and said at least one cold side heat exchanger, said at least one thermoelectric module defining a hot surface and a cold surface and comprising:
        a) a crate having the form of an eggcrate defining a plurality of thermoelectric element spaces,
        b) a plurality of p-type thermoelectric elements,
        c) a plurality of n-type thermoelectric elements, said p-type and said n-type thermoelectric elements being positioned in said thermoelectric element spaces,
        d) a metallized coating on said cold surface connecting p-type thermoelectric elements to n-type thermoelectric elements on said cold surface,
        e) a metallized coating on said hot surface connecting p-type thermoelectric elements to n-type thermoelectric elements on said hot surface, the position so said p-type and said n-type elements, the configuration of said eggcrate and said metallized coatings being effective to cause a plurality of said thermoelectric elements to be connected electrically in series.

2. A thermoelectric generator as in claim 1 and further comprising a compression means for maintaining close contact between said module and said heat exchangers.

3. A thermoelectric generator as in claim 2 wherein said compression means comprises at least one Bellville spring stack.

4. A thermoelectric generator as in claim 1 wherein said crate is an injection molded crate.

5. A thermoelectric generator as in claim 4 wherein said injection molded crate is comprised of high temperature plastic.

6. A thermoelectric generator as in claim 5 wherein said high temperature plastic is a liquid crystal plastic.

7. A thermoelectric generator as in claim 6 wherein said high temperature liquid crystal plastic is Dupont Zenite.

8. A thermoelectric generator as in claim 4 wherein said high temperature plastic is a silicone plastic.

9. A thermoelectric generator as in claim 4 wherein said injection molded crate is comprised of an electrically insulating ceramic material.

10. A thermoelectric generator as in claim 4 wherein said metallized coatings comprise a layer of molybdenum and a layer of aluminum.

11. A thermoelectric generator as in claim 4 wherein said metallized coatings comprise a layer of a nickel-aluminum alloy.

12. A thermoelectric generator as in claim 1 wherein said heat exchanger is cooled with glycol.

13. A thermoelectric generator as in claim 4 wherein said crate contains walls which are tapered to permit easy installation of said thermoelectric elements.

14. A thermoelectric generator as in claim 7 wherein each of said plurality of thermoelectric spaces define four intersections at the intersections of said walls and further comprising a stop means at at least three of said intersections for limiting the depth of insertion of said thermoelectric elements.

15. A thermoelectric generator as in claim 1 said hot and cold surfaces each defining a surface plane and a surface boundary and further comprising at least one molded support ridge which is outside said surface boundary and between said surface planes.

16. A thermoelectric generator as in claim 1 wherein said thermoelectric elements comprise extruded elements.

17. A thermoelectric element as in claim 1 wherein said metallized coatings comprise a layer of molybdenum and a layer of aluminum.

18. A thermoelectric element as in claim 1 wherein said metallized coatings comprise a layer of a nickel-aluminum alloy.

19. A process for fabricating a thermoelectric generator comprising a plurality of thermoelectric modules, each module defining hot and cold surfaces comprising the steps of:
    a) injection molding a plurality of crates from an insulating material in the form of an eggcrate defining a plurality of thermoelectric spaces and upper and lower surface edges,
    b) extruding an ingot of p-type thermoelectric material,
    c) slicing said ingot of p-type thermoelectric material into a plurality of p-type thermoelectric elements,
    d) extruding an ingot of n-type thermoelectric material,
    e) slicing said ingot of n-type thermoelectric material into a plurality of p-type thermoelectric elements,
    f) inserting said p-type thermoelectric elements and said n-type thermoelectric elements into said thermoelectric spaces in a predetermined pattern,
    g) providing electrical connections through metallized coatings on said hot side of each of said modules and on said cold side of each of said modules so as to connect a plurality of said elements in series,
    h) fabricating a cold side heat exchanger and a hot side heat exchanger,
    i) assembling said module in compression between said cold side heat exchanger and said hot side heat exchanger.

20. A process as in claim 19 wherein the provision of electrical connections are provided utilizing a thermal spraying and said process of thermal spraying comprises thermal spraying of at least one metal coating on each of said hot and cold surfaces and finishing off a portion of said coatings so as to expose the upper and lower surface edges of the eggcrate.

* * * * *